United States Patent [19]
Yamamoto et al.

[11] Patent Number: 5,150,196
[45] Date of Patent: Sep. 22, 1992

[54] HERMETIC SEALING OF WAFER SCALE INTEGRATED WAFER

[75] Inventors: Kio Yamamoto, Los Angeles; Stewart O. Fong, Torrance, both of Calif.

[73] Assignee: Hughes Aircraft Company, Los Angeles, Calif.

[21] Appl. No.: 380,948

[22] Filed: Jul. 17, 1989

[51] Int. Cl.[5] .................................... H01L 23/32
[52] U.S. Cl. ..................... 357/74; 357/75; 357/80
[58] Field of Search ........................ 357/74, 75, 80

[56] References Cited

U.S. PATENT DOCUMENTS

| | | | |
|---|---|---|---|
| 4,288,841 | 9/1987 | Gogal | 357/75 |
| 4,371,912 | 2/1983 | Guzik | 357/75 |
| 4,667,219 | 5/1987 | Lee et al. | 357/74 |
| 4,701,424 | 10/1987 | Mikkor | 437/209 |
| 4,701,999 | 10/1987 | Palmer | 437/111 |
| 4,709,468 | 12/1987 | Wilson | 357/75 |
| 4,802,062 | 1/1989 | Blum et al. | 361/401 |
| 4,825,282 | 4/1989 | Fukaya | 357/74 |
| 4,837,184 | 6/1989 | Lin et al. | 357/74 |
| 4,905,075 | 2/1990 | Temple et al. | 357/75 |

FOREIGN PATENT DOCUMENTS

| | | | |
|---|---|---|---|
| 0320660 | 6/1989 | European Pat. Off. | 357/75 |
| 58-108769 | 6/1983 | Japan | 357/75 |
| 59-215762 | 12/1984 | Japan . | |
| 61-269352 | 11/1986 | Japan . | |
| 8102367 | 8/1981 | PCT Int'l Appl. . | |
| 8704566 | 7/1987 | PCT Int'l Appl. | 357/75 |
| 8802552 | 4/1988 | PCT Int'l Appl. | 357/75 |

Primary Examiner—Andrew J. James
Assistant Examiner—Viet Q. Nguyen
Attorney, Agent, or Firm—M. E. Lachman; W. J. Streeter; W. K. Denson-Low

[57] ABSTRACT

A hermetically sealed integrated wafer wherein the integrated wafer is sandwiched between a support layer and expansion buffering layer. The expansion buffering layer includes a centrally-located opening through which integrated circuits located on the wafer may extend. A sealing ring and cover plate are bonded to the expansion buffering layer to provide hermetic sealing of integrated circuits or other electronic elements located on the wafer.

14 Claims, 2 Drawing Sheets

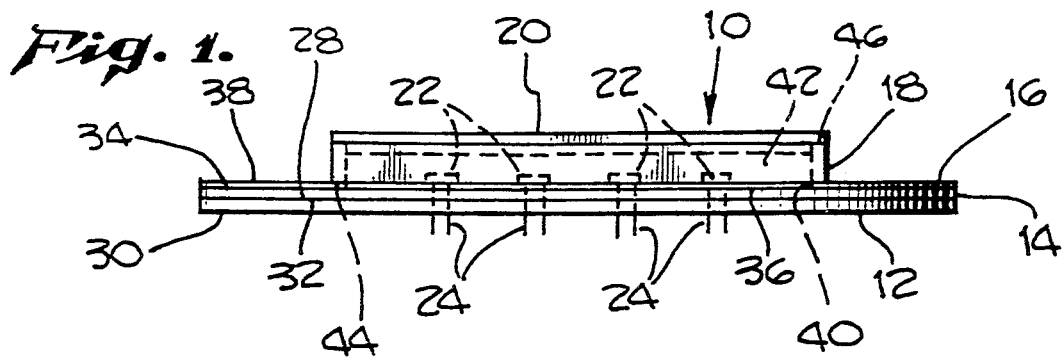
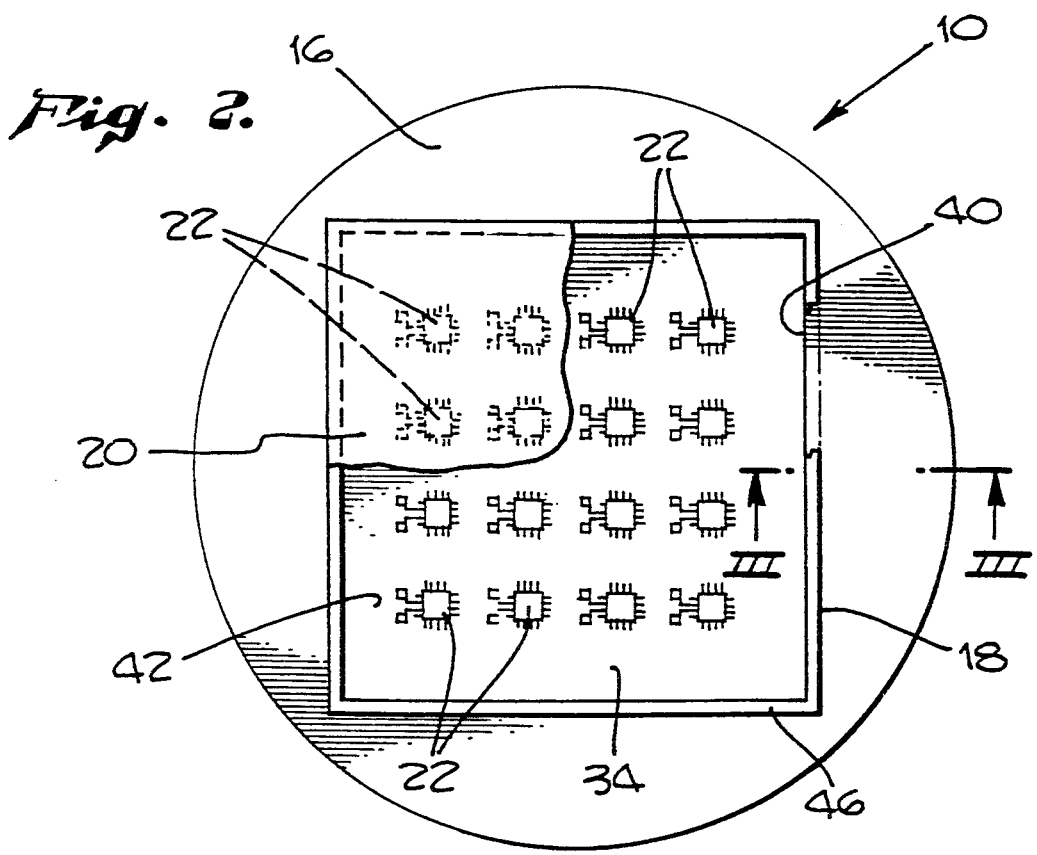
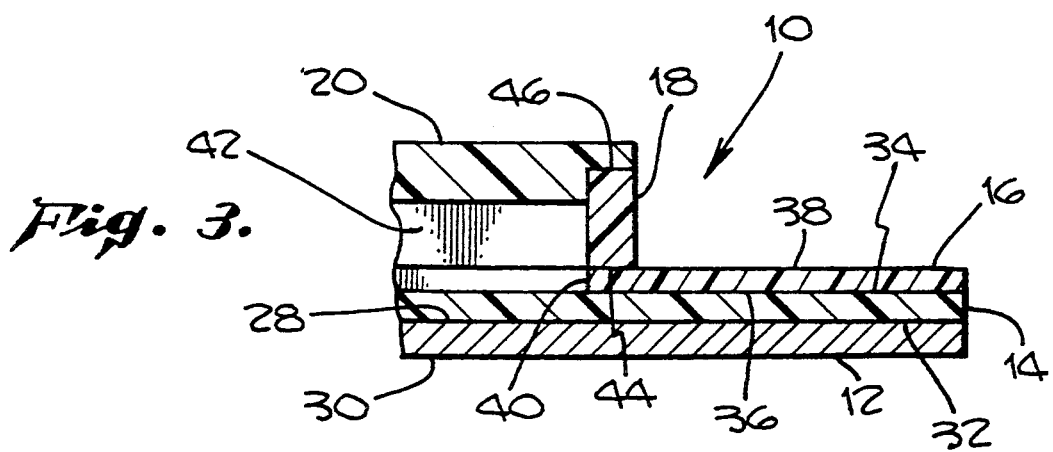

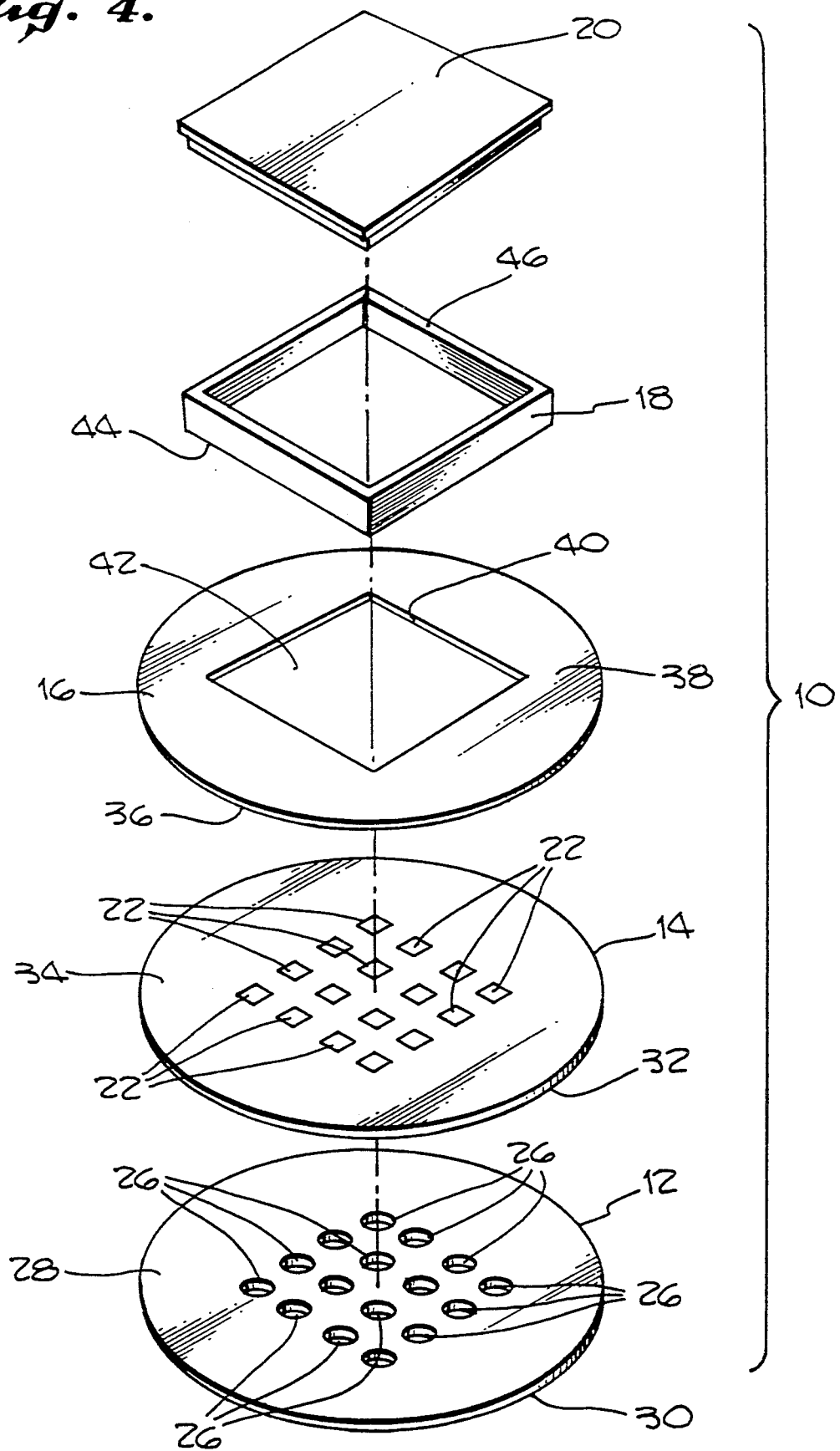

HERMETIC SEALING OF WAFER SCALE INTEGRATED WAFER

BACKGROUND OF THE INVENTION

1. Field of the Invention

The present invention relates generally to the hermetic sealing of wafer scale silicon wafers having interconnected integrated circuits thereon. More particularly, the present invention involves sealing configurations which reduce the overall size of the hermetically sealed unit for housing the wafer scale integrated wafer.

2. Description of Related Art

Integrated silicon wafers must have their electrically active sections protected in a hermetically sealed enclosure in order for the device to work in a real world environment. The present methods for providing such hermetic sealing involve housing all electronic circuits and hybrids in a hermetic enclosure made of kovar or ceramic. Since most silicon wafers are in the 4-inch (10.2 cm) size range, the hermetic housing structures necessary to surround the electronic assembly have tended to be large and complex. The large size and complexity of such hermetic sealing housings becomes even more of a problem when silicon wafers having diameters in the 5-inch (12.7 cm) to 7-inch (17.8 cm) range are utilized.

In addition to their heavy weight and bulkiness, the separate sealing structures make it difficult to stack the silicon wafers. Accordingly, interwafer signal propagation fidelity and speed are compromised. The size and weight of the hermetically sealed structures also make them undesirable for airborne electronic systems and other uses where the size and weight of the electronic system is minimized.

There presently is a need to provide a new system or configuration for sealing integrated wafers which reduces system size and weight while providing signal integrity gain and increased interwafer signal propagation fidelity and speed.

SUMMARY OF THE INVENTION

In accordance with the present invention, a hermetically sealed integrated wafer is disclosed in which the wafer becomes an integral part of the sealing structure to thereby eliminate the size and weight of a separate sealing structure. The invention is based upon providing a hermetically sealed integrated wafer wherein the wafer is sandwiched between a support layer and an expansion buffering layer. The support layer is bonded to the bottom of the wafer in order to provide stiffening and support of the wafer. The expansion buffering layer is bonded to the top of the wafer and includes a centrally-located opening through which integrated circuits located on the top of the integrated wafer may extend. A sealing ring is bonded to the expansion buffering layer to provide a seal wall surrounding the central opening in the expansion buffering layer where the integrated circuits are located. A cover plate is bonded to the top of the sealing ring to form a sealing ring housing which provides a complete hermetic seal surrounding the integrated circuits.

As a feature of the present invention, the sandwich structure utilizes the integrated wafer as part of the sealing structure to thereby reduce the weight and bulkiness of the system. Further, since separate sealing structures have been eliminated, the integrated wafers can be individually sealed and stacked. As a result, interwafer signal propagation fidelity and speed are enhanced.

The present invention has particular application to silicon integrated wafers. As a feature of the present invention, it was discovered that materials for the expansion buffering layer and sealing ring can be chosen to minimize problems with respect to differential thermal expansion between the silicon wafer and the surrounding sandwich structure. Kovar is a preferred sealing ring and cover plate material because of its wide use in providing hermetic seal housings for electronic assemblies. However, the thermal coefficient of expansion (TCE) of kovar does not match well with the TCE for silicon. Accordingly, as a feature of the present invention, the expansion buffering layer is made from a material having a TCE between these two materials to thereby provide stress reduction and positive hermetic sealing throughout a wide temperature range. Molybdenum or aluminum nitride have the necessary TCE and other physical properties which make them well suited for use in forming both the expansion buffering layer and underlying support layer.

The above-described and many other features and attendant advantages of the present invention will become better understood by reference to the following detailed description when taken in conjunction with the accompanying drawings.

BRIEF DESCRIPTION OF THE DRAWINGS

FIG. 1 is a side view of a preferred hermetically sealed integrated wafer in accordance with the present invention.

FIG. 2 is a top view of the hermetically sealed integrated wafer shown in FIG. 1.

FIG. 3 is a detailed view of a portion of the hermetically sealed integrated wafer shown in FIG. 1.

FIG. 4 is an exploded view of the hermetically sealed integrated wafer shown in FIGS. 1 and 2.

DESCRIPTION OF THE PREFERRED EMBODIMENTS

The present invention may be used to provide hermetic sealing of a wide variety of integrated wafers. Integrated wafers which may be sealed include thin film wafers wherein a variety of thin film semiconductor materials are deposited onto an underlying substrate. However, the present invention is especially well-suited for use in sealing wafer scale silicon integrated wafers. Accordingly, the following description of the invention will be limited to a discussion of hermetically sealing silicon integrated wafers. Although the following description is limited to silicon wafers, it will be understood that this is a preferred embodiment and that the invention may be used for sealing other wafers used in fabricating integrated circuits.

A preferred hermetically sealed integrated wafer is shown in FIGS. 1 and 2 at 10. An exploded view of the hermetically sealed integrated wafer is shown in FIG. 4 wherein the identification numerals correspond to the elements shown in FIGS. 1 and 2. The hermetically sealed integrated wafer 10 includes a support layer 12, silicon Wafer 14, expansion buffering layer 16, sealing ring 18, and cover plate 20. Integrated circuits 22 are mounted on the top of silicon wafer 14 with electrical connections 24 extending from the bottom of the assembly as best shown in FIG. 1.

The support layer 12 is made from a material which is sufficiently stiff to provide suitable support for the silicon wafer 14 while also having a thermal coefficient of expansion (TCE) which is compatible with the silicon wafer. Suitable materials include aluminum nitride and molybdenum. Molybdenum is a preferred material because it not only provides adequate support, but also has a TCE of $4.5 \times 10^{-6}$ inches/° C. ($15.2 \times 10^{-6}$ cm/° C.) as compared to $3.8 \times 10^{-6}$ inches/° C. (9.6 cm/° C.) for silicon. The support layer 12 is preferably between about 0.015-inch (0.038 cm) and 0.030-inch (0.076 cm) thick. The support layer 12 can be formed in any shape and configuration to provide support to the bottom of the silicon wafer 14 and preferably covers the entire bottom of the silicon wafer. The support layer 12 is preferably a circular disk having a diameter equal to the diameter of the silicon wafer 14. Typical diameters for silicon wafers 14 and support layers 12 are from 4 inches (10.2 cm) to 7 inches (17.8 cm). The support layer 12 includes integrated circuit openings 26 (see FIG. 4) which are of sufficient size to allow the integrated circuit electrical connections 24 to pass therethrough.

The support layer 12 includes a top surface 28 and a bottom surface 30. The top surface 28 is bonded to the bottom surface 32 of the silicon wafer 14 by any suitable bonding technique which provides a good bond and hermetic sealing between the silicon wafer 14 and support layer 12. Preferably, the support layer 12 is bonded to the wafer 14 using solder paste. ESL 3701 solder paste, obtained from Electro Science Laboratories of Pennsauken, N.J., is a preferred solder for use in bonding a molybdenum support layer to the silicon wafer.

The silicon wafer 14 includes a top surface 34 upon which integrated circuits 22 or other electronic assemblies are mounted. The silicon wafer 14 is prepared in accordance with conventional procedures which are well known and will not be described in detail.

The expansion buffering layer 16 includes a bottom surface 36 and top surface 38. The expansion buffering layer 16 includes a centrally located square perimeter 40 which defines an integrated circuit opening 42 into which the integrated circuits 22 extend. Although the opening 42 is shown in a square shape, other possible configurations including circular, rectangular, elliptical, etc., may be formed in the expansion buffering layer 16 provided that the opening is of sufficient size to accommodate the desired electronic assemblies present on the top of the silicon wafer 14.

The expansion buffering layer is made from materials which are sufficiently strong to provide upper support for silicon wafer 14 while at the same time having a TCE which is compatible both with the silicon wafer and the sealing ring 18. Preferred materials include molybdenum, tungsten and tungsten-copper alloys. Molybdenum is a preferred material due to its TCE of $4.5 \times 10^{-6}$ inches/° C. (11.4 cm/° C.) which is midway between the TCE of silicon at $3.8 \times 10^{-6}$ inches/° C. (9.6 cm/° C.) and the TCE of kovar at $6.0 \times 10^{-6}$ inches/° C. ($15.2 \times 10^{-6}$ cm/° C.). As will be discussed below, kovar is a preferred material from which sealing ring 18 is made. The expansion buffering layer 16 preferably has a thickness of between about 0.020-inch (0.051 cm) and 0.030-inch (0.076 cm).

The bottom surface 36 of the expansion layer is bonded to the silicon wafer top surface 34 using any of the conventional bonding techniques commonly employed in fabricating electronic assemblies. The bonding adhesive or material must provide a solid bond which is hermetic. Preferably, the same ESL 3701 solder paste used to bond the support layer 12 to the wafer 14 is also used in bonding the expansion buffering layer 16 to wafer 14. It is preferred that the outside diameters for the support layer 12, wafer 14 and expansion buffering layer 16 all be the same in order to minimize the overall size of the hermetically sealed integrated wafer 10.

The sealing ring 18 includes a bottom surface 44 and a top surface 46. The sealing ring 18 is shaped so that it provides a seal around the perimeter 40 of the expansion buffering layer 16. As shown in the figures, the sealing ring 18 sits on top of and is bonded to the top surface 38 of the expansion layer 16. This configuration provides thermal buffering of the expansion between the sealing ring 18 and silicon wafer 14. The sealing ring 18 is shaped to match the expansion buffering layer perimeter 40.

The sealing ring 18 is made from kovar or metalized ceramics which are conventionally used in providing hermetic sealing of integrated circuit assemblies. Kovar has been widely used in the fabrication of all metal radio tubes and to cement glass in vacuum apparatus. Kovar includes a group of alloys having the following exemplary composition: iron 53.8 weight percent, nickel 29 weight percent, cobalt 17 weight percent and manganese 0.2 weight percent. Kovar is the preferred material for the sealing ring 18. Metalized ceramics are also conventional materials which have been used in the fabrication of electronic assemblies. An exemplary metalized ceramic is an alumina ring with metalized edges.

The sealing ring 18 must be sufficiently thick so that top surface 46 extends above the electronic assemblies housed within opening 42. Typically, the seal ring will have a thickness of around 0.040 inch (0.10 cm). The bottom surface 44 of the sealing ring may be bonded to the expansion layer top surface 38 by conventional bonding techniques. In the preferred embodiment, the ring frame 18 is made from kovar and is bonded to the expansion layer with tin/lead or gold/tin solder.

The cover plate 20 is preferably bonded to sealing ring 18 as best shown in FIG. 3. The cover plate 20 must be sufficiently thick so that it does not collapse or break at pressures up to around 30 pounds per square inch gauge (1551.3 millimeters Hg). The kovar lid is generally on the order of 0.030-inch (0.08 cm) to 0.04-inch (0.10 cm) thick. The cover plate 20 is preferably bonded to the top of the sealing ring 46 by conventional bonding materials used in fabricating kovar assemblies. Preferably, the kovar sealing ring 18 is bonded to the cover plate 20 by seam welding.

A hermetically sealed wafer scale integrated wafer as shown in the figures was prepared in which a silicon wafer 14 was sandwiched between a molybdenum support layer and a molybdenum expansion buffer layer. Both the molybdenum support layer and the molybdenum expansion layer were 0.020-inch (0.051 cm) thick. The two molybdenum layers were bonded to the silicon wafer using ESL 3701 solder paste which was treated in accordance with conventional soldering procedures to provide a hermetically sealed solder joint. The diameters of the support layer, silicon wafer and expansion buffering layer were all 4.0-inch (10.2 cm).

A kovar sealing ring was bonded to the expansion buffering layer around the centrally-located perimeter. Bonding was accomplished with tin/lead solder. The ring had an inside diameter of 3.18 inch (8.08 cm) and an outside diameter of 4.0 inch (10.2 cm). A 0.040 inch (0.10 cm) thick cover plate of kovar was then attached to the sealing ring using the step-lid configuration shown in the figures followed by seam welding of the kovar. The resulting hermetically sealed package was then checked for hermeticity in accordance with Method 1014 of MIL-STD-883 (Military Standard, Test Methods and Procedures for Microelectronics). The package passed the fine and gross leak requirements of MIL-STD-883. The hermetically sealed assembly was thermally cycled ten times between temperatures of −55° C. and 125° C. The assembly hermeticity after the ten thermal cycles and found to again pass the MIL-STD-883 test.

As is apparent from the above disclosure, the present invention provides a hermetically sealed wafer scale integrated wafer wherein the weight and bulk of the assembly are greatly reduced due to sandwiching of the silicon wafer between structurally strong layers which are thermally compatible with the silicon. The thermal compatibility of the expansion buffering layer provides relief from possible thermally generated stresses between the upper kovar sealing ring and the silicon wafer to make such an assembly possible. The use of the expansion buffering layer renders this sealing assembly effective over a wide range of temperatures and pressures. Accordingly, the assembly is well suited for use where the electronic equipment will be exposed to a wide range of temperature and pressure fluctuations. In addition, the compact configuration of the assembly renders it especially well suited for aerospace and other applications where size and weight are important considerations.

Having thus described exemplary embodiments of the present invention, it should be noted by those skilled in the art that the within disclosures are exemplary only and that various other alternatives, adaptations and modifications may be made within the scope of the present invention. Accordingly, the present invention is not limited to the specific embodiments as illustrated herein, but is only limited by the following claims.

What is claimed is:

1. A hermetically sealed integrated wafer comprising:
   a wafer having a top surface, a bottom surface and a centrally located integrated circuit zone adapted to receive multiple integrated circuits;
   a support layer having a top surface and a bottom surface, said top surface being sealingly bonded to said wafer bottom surface and wherein said support layer includes openings to provide electrical access through said support layer to each said integrated circuit in said integrated circuit zone;
   an expansion buffering layer having a top surface and a bottom surface, said bottom surface being sealingly bonded to said wafer top surface, said expansion buffering layer including a centrally located perimeter defining an integrated circuit opening through which integrated circuits located in said integrated circuit zone may be exposed;
   a sealing ring housing surrounding said centrally located perimeter, said sealing ring housing having a bottom surface sealingly bonded to said top surface of said expansion buffering layer to thereby provide hermetic sealing of the integrated circuit zone, wherein said expansion buffering layer provides thermal buffering of expansion between said sealing ring housing and said wafer; and
   a covering plate sealingly bonded to said top surface of said sealing ring.

2. A hermetically sealed integrated wafer according to claim 4 wherein said integrated wafer is comprised of silicon.

3. A hermetically sealed integrated wafer according to claim 2 wherein said support layer is made from aluminum nitride or molybdenum.

4. A hermetically sealed silicon integrated wafer according to claim 2 wherein said expansion buffering layer is made from molybdenum or tungsten.

5. A hermetically sealed silicon integrated wafer according to claim 3 wherein said expansion buffering layer is made from molybdenum or tungsten.

6. A hermetically sealed silicon integrated wafer according to claim 2 wherein said sealing ring housing is made from kovar or a metalized ceramic.

7. A hermetically sealed silicon integrated wafer according to claim 3 wherein said sealing ring housing is made from kovar or a metalized ceramic.

8. A hermetically sealed silicon integrated wafer according to claim 4 wherein said sealing ring housing is made from kovar or a metalized ceramic.

9. A hermetically sealed integrated wafer according to claim 1 wherein said cover plate and sealing ring are made from kovar or a metalized ceramic.

10. A hermetically sealed integrated wafer according to claim 9 wherein said support layer and expansion buffering layer are made from aluminum nitride or molybdenum.

11. A hermetically sealed silicon integrated wafer according to claim 2 further including at least one integrated circuit mounted within said integrated circuit zone.

12. A hermetically sealed silicon integrated wafer according to claim 2 wherein the thickness of said support layer is between about 0.015-inch (0.038 cm) and 0.030-inch (0.076 cm).

13. A hermetically sealed silicon integrated wafer according to claim 2 wherein said expansion buffering layer has a thickness of between about 0.020-inch (0..051 cm) and 0.030-inch (0.076 cm).

14. A hermetically sealed silicon integrated wafer according to claim 2 wherein said support and expansion buffering layers are made from molybdenum and said sealing ring and cover plate are made from kovar.

* * * * *